(12) United States Patent
Fan et al.

(10) Patent No.: US 7,671,635 B2
(45) Date of Patent: Mar. 2, 2010

(54) FREQUENCY SYNTHESIZER, COUPLED DIVIDE-BY-N CIRCUIT, CURRENT-REUSE MULTIPLY-BY-M CIRCUIT

(75) Inventors: Che-Wei Fan, Taipei (TW); Shen-Iuan Liu, Taipei (TW)

(73) Assignee: National Taiwan University, Taipei (TW)

( * ) Notice: Subject to any disclaimer, the term of this patent is extended or adjusted under 35 U.S.C. 154(b) by 56 days.

(21) Appl. No.: 11/961,130

(22) Filed: Dec. 20, 2007

(65) Prior Publication Data

US 2009/0067563 A1     Mar. 12, 2009

(30) Foreign Application Priority Data

Sep. 12, 2007   (TW)   ............................... 96134133 A

(51) Int. Cl.
  *H03B 21/00* (2006.01)
(52) U.S. Cl. ........................ 327/105; 327/156; 327/355
(58) Field of Classification Search ................. 327/105, 327/155–159, 355, 361, 40, 42, 44; 331/1 A, 331/37–39, 42, 43, 47
See application file for complete search history.

(56) References Cited

U.S. PATENT DOCUMENTS

| 4,458,329 | A | * | 7/1984 | Remy | 708/845 |
| 4,839,603 | A | * | 6/1989 | Mower et al. | 327/105 |
| 5,497,128 | A | * | 3/1996 | Sasaki | 331/38 |
| 6,791,371 | B1 | * | 9/2004 | Cheung | 327/63 |
| 2009/0033440 | A1 | * | 2/2009 | Masuda et al. | 333/215 |

* cited by examiner

*Primary Examiner*—An T Luu
(74) *Attorney, Agent, or Firm*—Volpe and Koenig, PC

(57) ABSTRACT

A frequency synthesizer is provided in the present invention. The frequency synthesizer includes a single phase-locked loop having a reference frequency signal input, a first output, a second output and a pair of divide-by-N circuits coupled with each other and electrically connected to the second output; a multiply-by-M circuit having a first input electrically connected to the first output and a third output; and a combination of a buffer and a mixer having a second input electrically connected to the second output and a third input electrically connected to the third output generating a frequency signal output.

11 Claims, 13 Drawing Sheets

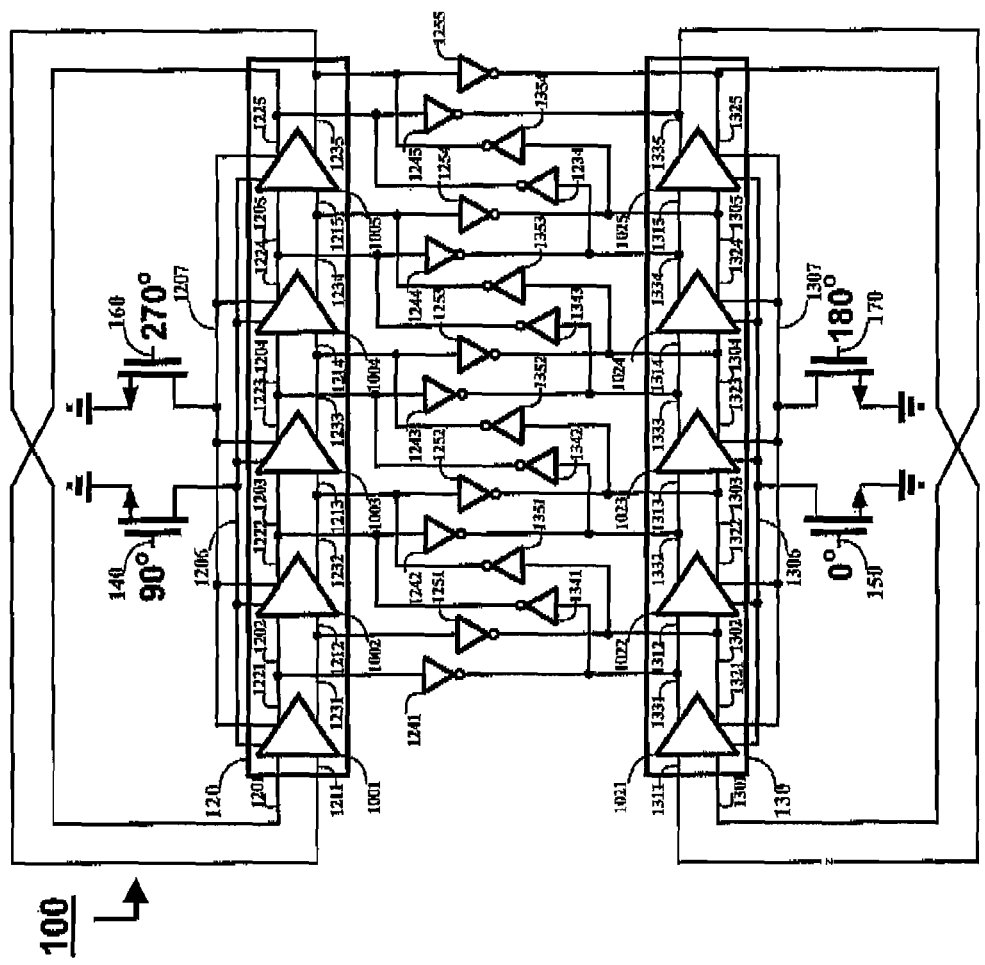
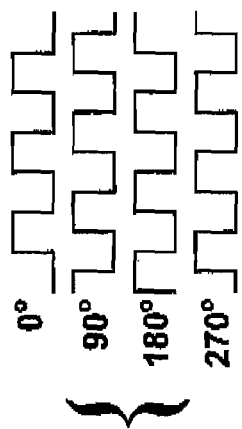
Fig. 7(a)
Fig. 7(b)

FREQUENCY SYNTHESIZER, COUPLED DIVIDE-BY-N CIRCUIT, CURRENT-REUSE MULTIPLY-BY-M CIRCUIT

FIELD OF THE INVENTION

The present invention relates to a frequency synthesizer, in particular, to a frequency synthesizer of the multiply-by-1.5 circuit.

BACKGROUND OF THE INVENTION

Please refer to FIG. 1, which is a diagram illustrating a frequency synthesizer according to the prior art. The frequency synthesizer is a kind of component used for providing various kinds of frequencies in one or many reference frequency circuits. Usually, in the frequency synthesizer, the multiply phase locked loop would be adopted therein in order to obtain a series of frequency signals. Take it as the example the frequency synthesizer architecture 1 illustrating in FIG. 1, where a phase locked loop 80 receives a reference frequency 81; a UP and DN signal are outputted by a phase frequency detector 91 in the phase locked loop 80; a digital comparison signal is transformed into an analogy current signal by a charge pump 92; a control voltage $V_{ctrl}$ is then obtained by filtering the analogy current signal through a loop filter 93 (low-pass filter); and this control voltage $V_{ctrl}$ is used for controlling a signal output of a voltage controlled oscillator (VCO) 94 and the signal output then passes a specific frequency divider. Finally, in accordance with the aforementioned, signals from different frequency bands could be generated via a single sideband mixer 82.

Please keep referring to FIG. 1. For the present state of the art, the phase locked loop 80 illustrated in FIG. 1 includes a loop filter 93, a frequency divider 95/96 and a voltage control oscillator 94, wherein the loop filter 93 is a low-pass filter that is usually consisted of the resistances and the capacitors etc. so that it would occupy more area for the circuit.

The frequency divider could be categorized into two types, one is an injected locked frequency divider (ILFD) and the other is a digital frequency divider. The former type has a lower power consuming when a higher operation frequency is adopted thereby, and it could be used to define a more precise phase relationship. Please keep referring to FIG. 1. Since the orthogonal signals 83/84 of a I-channel and a Q channel are required to be involved in the mixer 82 of the multiply bands system so as to synthesize the signal 85 of a specific wave band and the phase deviation will determine whether the other frequency signals could be suppressed in order to provide a smaller spur wave on the outputted frequency band, a precise phase could helpfully enhance the performance of the in-band spur wave; and the latter type has a lower workable frequency, could provide a fractional frequency divider ratio, has no static power consuming and could further reduce the dynamic power consuming through the True-Signal-Phase-Clock (TSPC) technique, but the phase relationship could not be guaranteed. Therefore, in this conventional way, the ILFD would be chosen to be used following the VCO, for instance a first frequency divider 95, but the digital frequency divider would be chosen to be used in front of the phase detector, for instance a second frequency divider.

The VCO 94 could be a coupled looped VCO 200 (referring to FIG. 2(a)) and since it has a lesser order, it saves energy and could perform better in the aspect of the noise than the conventional looped VCO 942 (referring to FIG. 3). However, due to the improvement of the technology, the scale of the circuit becomes more and more miniature and the magnitude of the power source are also decreased so that the permitted oscillating amplitude is also decreased thereaccording. In order to deal with the variation of the manufacturing process, for the VCO, a smaller range of the control voltage is required and simultaneously the required bandwidth must also be covered thereby. (referring to FIG. 2(b)) for a conventional single order VCO circuit 943, a fixed resistive load 944 is used to adjust the characteristic curve of the VCO voltage with respect to the frequency so as to raise the Kvco (the variation of the frequency/the control voltage to the linear portion of the curve and magnitude of the slope to the linear portion of the curve). But the raise of the Kvco would influence the performance to the spur wave. Besides, it frequently needs to generate a series of frequencies with fractional ratio in the orthogonal frequency division multiply super wideband, but the first frequency divider 95 of the injected locked type could merely generate an integer ratio. Hence, a fractional type circuit shall be therefore provided, for instance the multiplication circuit 86. In prior art, the fractional type circuit is usually consisted of a multiplier and a divider. In terms of the multiplication circuit 86, it is consisted of a multiplier 87 that is combined with a divider 88. For example, in the conventional technique, a divided-by-2 circuit 98 (referring to FIGS. 5(a), 5(b)) is merged with a multiply-by-3 circuit 97 (referring to FIG. 4) in order to complete the purpose to multiply by 1.5. Nevertheless, since these two circuits are usually operated with a higher workable frequency that consumes massive power and the multiply-by-3 circuit includes the passive component, these two circuits occupy more circuit area.

To overcome the mentioned drawbacks of the prior art, a surface treatment method and device thereof are provided.

SUMMARY OF THE INVENTION

According to the first aspect of the present invention, a frequency synthesizer is provided. The frequency synthesizer includes a single phase-locked loop having a reference frequency signal input, a first output, a second output and a pair of divide-by-N circuits coupled with each other and electrically connected to the second output; a multiply-by-M circuit having a first input electrically connected to the first output and a third output; and a combination of a buffer and a mixer having a second input electrically connected to the second output and a third input electrically connected to the third output generating a frequency signal output.

Preferably, the single phase-locked loop further includes a frequency detecting circuit having the reference frequency signal input and a feedback frequency input, and generating a detecting signal output; a voltage controlled oscillator (VCO) having a detecting signal input electrically connected to the detecting signal output, a fourth output and the first output, wherein the pair of divide-by-N circuits further include a fourth input electrically connected to the fourth output and a fifth output; and a divide-by-P circuit having a fifth input electrically connected to the fifth output and a frequency feedback output electrically connected to the frequency feedback input.

Preferably, the frequency detecting circuit further includes a phase frequency detecting circuit electrically connected to the reference frequency signal input and the feedback frequency input; a charge pump electrically connected to the phase frequency detecting circuit; and a low-pass filter electrically connected to the charge pump and the detecting signal output.

Preferably, a plurality of inverters are connected to each of the pair of divide-by-N circuits so as to reduce a mismatch generated therefrom.

Preferably, the multiply-by-M circuit is a multiply-by-1.5 circuit, which has a multiply-by-3 circuit electrically connected to the first input and a divide-by-2 circuit electrically connected to the multiply-by-3 circuit and the third output, and the divide-by-2 circuit is a current mode logic (CML) divide-by-2 circuit.

Preferably, the combination of the buffer and the mixer includes a buffer being a tri-mode buffer and a mixer being a single baseband mixer.

According to the second aspect of the present invention, a frequency synthesizer is provided. The frequency synthesizer includes a single phase-locked loop having a reference frequency signal input, a first output, a second output and a pair of voltage controlled oscillators (VCOs) coupled with each other and electrically connected to the first output, wherein each VCO has N circuit cells, each of which has a digital multiband selective load circuit selecting a band among different oscillating bands; a multiply-by-M circuit having a first input electrically connected to the first output and a third output; and a combination of a buffer and a mixer having a second input electrically connected to the second output and a third input electrically connected to the third output, and generating a frequency signal output.

Preferably, the single phase-locked loop further includes a frequency detecting circuit having the reference frequency signal input and a feedback frequency input, and generating a detecting signal output, wherein the pair of VCOs further include a detecting signal input electrically connected to the detecting signal output, a fourth output and the first output.

Preferably, the pair of VCOs include a first oscillator having a first control input, a first first input, a first second input and a first first output, wherein the first control input receives a control signal; and a second oscillator having a second control input, a second first input, a second second input and a second first output, wherein the control signal is received by the second control input, each VCO has a circuit cell, and each circuit cell has a digital multiband selective load circuit selecting a band among different oscillating bands.

Preferably, the digital multiband selective load circuit includes a plurality of PMOSs, and each PMOS is controlled by the digital band selective circuit and has different load.

Preferably, the pair of VCOs are selected from one of a coupled N stage VCO and a coupled ring type VCO.

According to the third aspect of the present invention, a coupled divide-by-N circuit is provided. The coupled divide-by-N circuit includes a first set of divide-by-N circuits having a first first orthogonal input, N first first inputs and N first first outputs, wherein the first first orthogonal input is controlled by a first first input signal; and a second set of divide-by-N circuits having a second first orthogonal input, N second first inputs and N second first outputs, wherein the second first orthogonal input is controlled by a second first input signal and the second first input signal and the first first input signal are orthogonal with each other.

Preferably, the circuit further includes N first first inverters respectively electrically connected between the corresponding Nth first first output and the corresponding Nth second first output.

Preferably, each set of the divide-by-N circuits include N circuit cells, wherein each circuit cell has one of the first first and the second first inputs and one of the first first and second first outputs, and the coupled divide-by-N circuit further includes N−1 second first inverters electrically connected between one of the N second first outputs and an Next first first output of one of the corresponding N first first outputs.

Preferably, each circuit cell includes an NMOS having a first gate, a first drain and a first source, and a PMOS having a second gate, a second drain and a second source, wherein the first gate is electrically connected to the second gate to form one of a first first and a second first inputs of each the circuit cell, the first drain is electrically connected to the second drain to form one of a first first and a second first outputs of each the circuit cell, one of the first first and the second first orthogonal inputs is formed by the first source, and the second source is electrically connected to a power.

Preferably, wherein each orthogonal input is electrically connected to a drain of an NMOS and each input signal is injected via a gate of the NMOS.

Preferably, one of the first first and the second first outputs is electrically connected to one of the next first first and second first inputs and one of the last first first and the second first outputs, and one of the last first first and the second first outputs is invertedly electrically connected to one of the foremost first first and second first inputs.

Preferably, the first set of the divide-by-N circuits further include a first second orthogonal input, N first second inputs and N first second outputs, wherein the first second orthogonal input is controlled by a first second input signal and the first second input signal is inverted to the first first input signal; and the second set of the divide-by-N circuits further include a second second orthogonal input, N second second inputs and N second second outputs, wherein the second second orthogonal input is controlled by a second second input signal and the second second input signal is orthogonal with the first second input signal and is inverted to the second first input signal.

Preferably, the circuit further includes N first second inverters respectively electrically connected between the corresponding N first second outputs and the N second second outputs.

Preferably, each set of the divide-by-N circuits include N circuit cells, wherein each circuit cell has one of the first second and the second second inputs and one of the first second and second second outputs, and the coupled divide-by-N circuit further includes N−1 second second inverters electrically connected between one of the N second second outputs and a next first second output of one of the corresponding N first second outputs.

Preferably, each circuit cell includes a first circuit having one of a first first and a second first inputs of each circuit cell, one of a first first and a second first orthogonal inputs of each the cell and a first power input end; and a second circuit having one of a first second and a second second inputs of each cell, one of a first second and a second orthogonal inputs of each the cell and a second power input end electrically connected to the first power input end.

Preferably, each the cell further includes a third circuit electrically connected between the first circuit and the second circuit and suppressing an Noise of the power, and the third circuit is a pair of cross-coupled PMOS.

Preferably, the third circuit has two third outputs serving as one of the first first and the first second outputs of each circuit cell and the second first and the second second outputs of each circuit cell; the first circuit includes a first NMOS having a first first gate, a first first drain and a first first source, and a first PMOS having a first second gate, a first second drain and a first second source, wherein the first first gate is electrically connected to the first second gate to form one of a first first and a second first inputs of each circuit cell, the first first drain is electrically connected to the first second drain to form one of a first first and a second first outputs of each circuit cell, the first first source includes one of the first first and the second first orthogonal inputs, and the first second source is electrically connected to a power, and the second circuit includes a second NMOS having a second first gate, a second first drain and a second first source, and a second NMOS having a second second gate, a second second drain and a second second source, wherein the second first gate is electrically connected to the second second gate to form one of a first second and a second second inputs of each circuit cell, the second first drain is electrically connected to the second second drain to form one of a second first and a second second outputs of each circuit cell, the second first source includes one of the first second and the second second orthogonal inputs, and the second second source is electrically connected to the power.

According to the fourth aspect of the present invention, a current-reuse multiply-by-M circuit is provided. The current-reuse multiply-by-M circuit includes a first sub-circuit having a first input; and a second sub-circuit having a first output, wherein the first sub-circuit is a multiply-by-p circuit, the second sub-circuit is a divide-by-q circuit electrically connected to the first sub-circuit, and the first and the second sub-circuits are driven by the same current.

Preferably, the first sub-circuit includes p pairs of differential input NMOSs, each the pair of differential input NMOSs have a gate differential input forming the first input, a drain first output and a drain second output, and the second sub-circuit is a CML divide-by-2 circuit having a first control input and a second control input, wherein the first control input is electrically connected to the first output of each the drain, and the second control input is electrically connected to the second output of each the drain.

The foregoing and other features and advantages of the present invention will be more clearly understood through the following descriptions with reference to the drawings:

BRIEF DESCRIPTION OF THE DRAWINGS

FIG. 7(a) is a diagram illustrating a coupled divide-by-5 circuit of the frequency synthesizer according to the present invention;

FIG. 7(b) is a diagram illustrating the signal relationship among the respective inputted signals of the coupled divide-by-5 circuit according to the frequency synthesizer in the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for the aspect of illustration and description only; it is not intended to be exhaustive or to be limited to the precise from disclosed.

Figure 6:
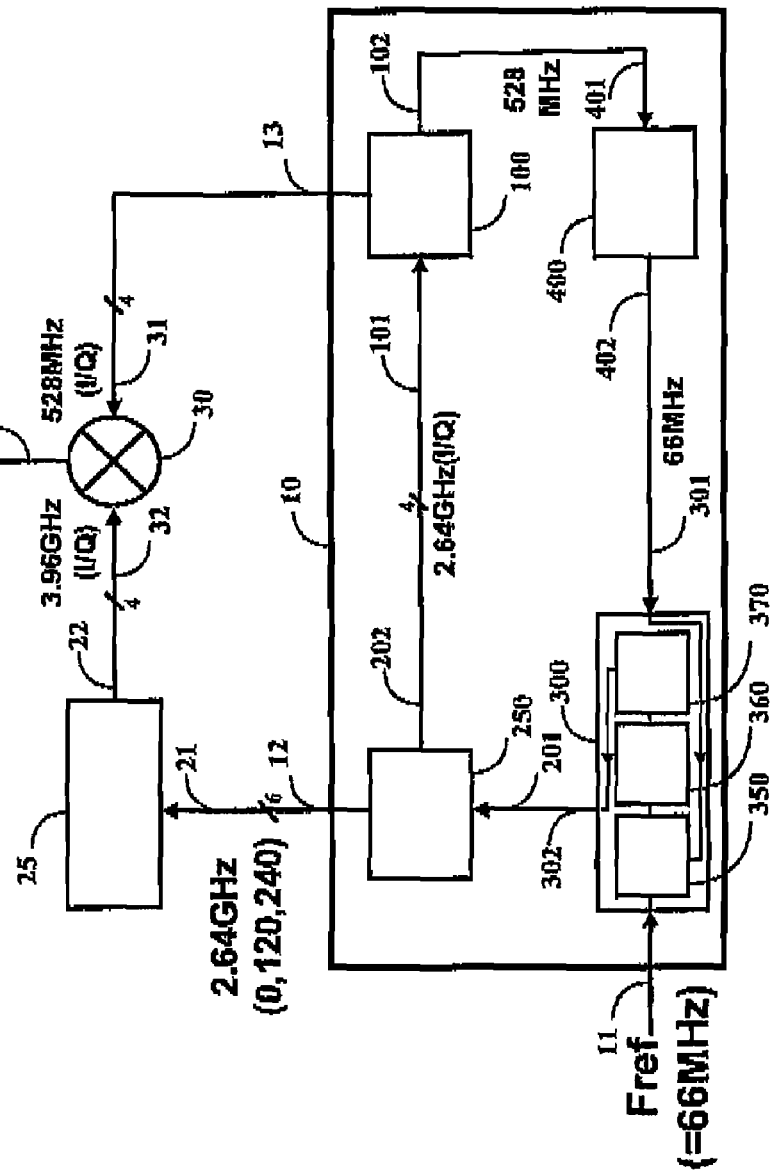
FIG. 6 is a diagram illustrating a first preferred embodiment of the frequency synthesizer according to the present invention.

Please refer to FIG. 6 which is a diagram illustrating a first preferred embodiment of the frequency synthesizer according to the present invention. The frequency synthesizer architecture 2 in accordance with the first preferred embodiment of the present invention which includes a single phase-locked loop 10 having a reference frequency signal input 11, a first output 12, a second output 13 and a pair of divide-by-5 circuits coupled with each other included in the single phase-locked loop 10 which circuits are a plurality of coupled divide-by-5 circuit and electrically connected to the second output 13. A multiply-by-1.5 circuit 25 having a first input 21 electrically connected to the first output 12 and a third output 22. A buffer and a combination of buffer and mixer 30 having a second input 31 electrically connected to the second output 13. A third input 32 electrically connected to the third output 22 for generating a frequency signal output 33.

The phase-locked loop 10 according to the present invention further includes a frequency detecting circuit 300 having the reference frequency signal input 11 and a feedback frequency input 301 for generating a detecting signal output 302. A voltage controlled oscillator 250 (VCO) has a detecting signal input 201 electrically connected to the detecting signal output 302, a fourth output 202 and the first output 12. Furthermore, the coupled divide-by-5 circuit 100 further has a fourth input 101 electrically connected to the fourth output 202, and a fifth output 101. A divide-by-8 circuit 400 has a fifth input 401 electrically connected to the fifth output 102 and a feedback frequency output 402 electrically connected to the feedback frequency input 301.

The frequency detecting circuit 300 of the phase-locked loop 10 further includes a phase frequency detecting circuit 350 electrically connected to the reference frequency signal input 11 and feedback frequency input 301. A charge pump 360 is electrically connected to the phase frequency detecting circuit 350. A low-pass filter 370 is electrically connected to the charge pump 360 and the detecting signal output 302.

Figures 7C, 7D:
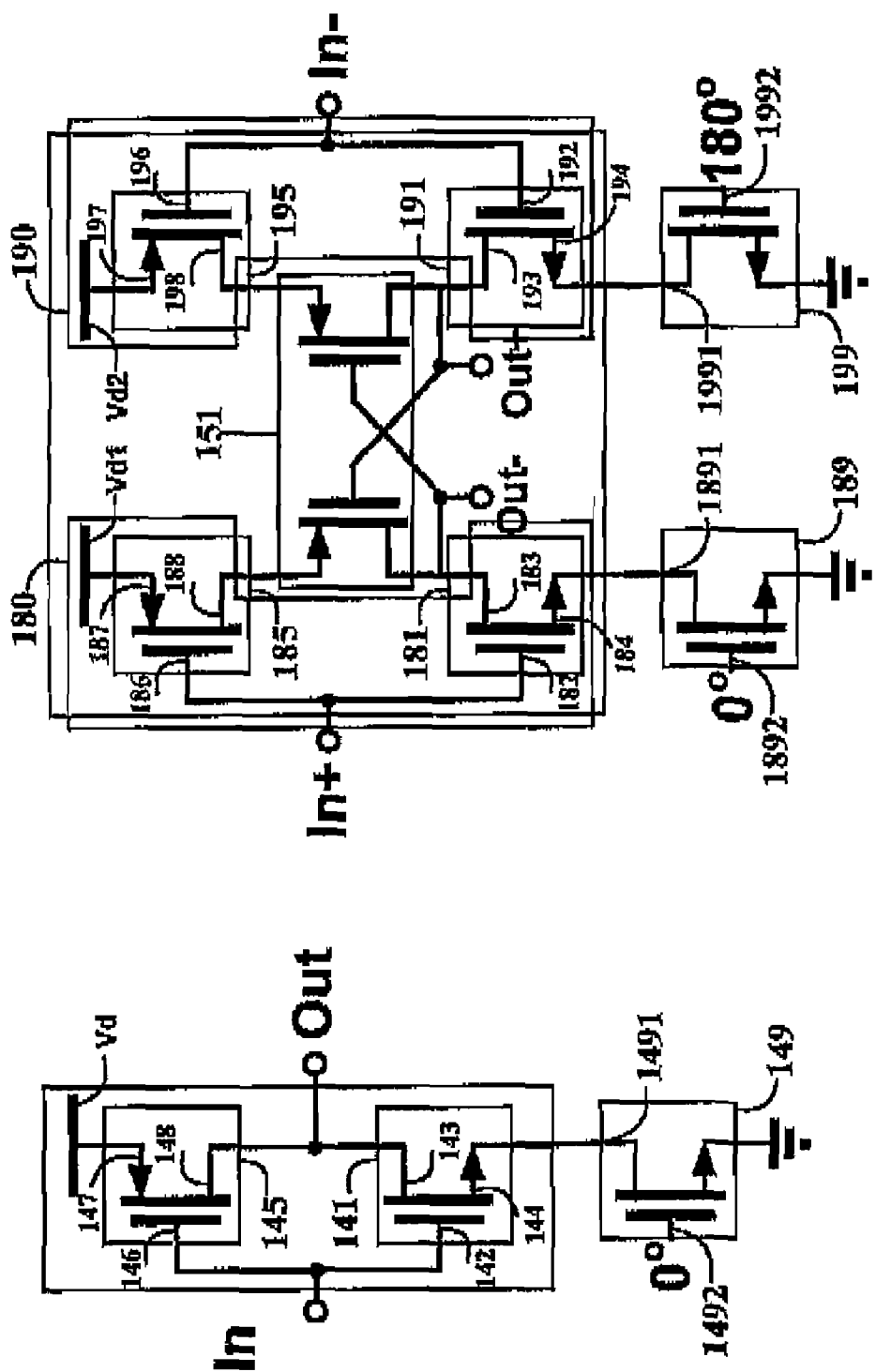
FIG. 7(c) is a diagram illustrating the each cells of the coupled divide-by-5 circuit according to the frequency synthesizer in the present invention.
FIG. 7(d) is a diagram illustrating the circuit cells having the first, second and third circuit of the coupled divide-by-5 circuit according to the frequency synthesizer in the present invention.
Figure 8:
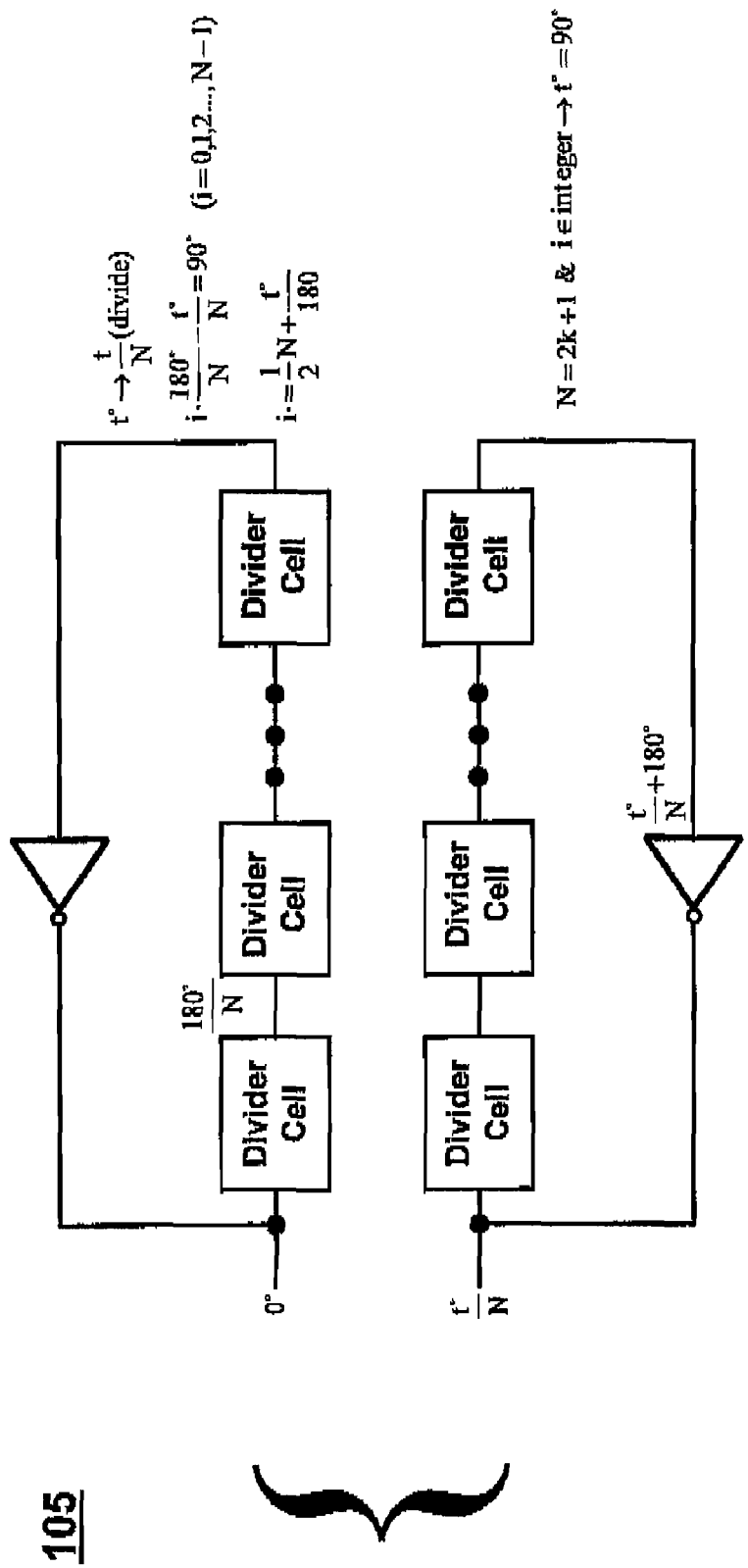
FIG. 8 is a diagram illustrating the odd-order looped frequency divider using an orthogonal input according to the frequency synthesizer in the present invention.

Please refer to FIG. 7(a) which is a diagram illustrating a coupled divide-by-5 circuit of the frequency synthesizer according to the present invention. A divide-by-5 circuit 100 according to the present invention is characterized in that it is an injected locked type frequency divider that could substantially reduce the power consuming. The cross-coupled PMOS 151 is further adopted by the coupled divide-by-5 circuit 100 to suppress the power noise. An inverter (more detail will be described later) electrically connected to the respective divide-by-5 circuits 100 so as to reduce a mismatch generated from the coupled circuit. Therefore, it is helpful to precisely define a phase. Besides, the buffer and the combination of buffer and mixer 30 of this architecture have to involve in orthogonal signals of an I-channel and a Q-channel so as to synthesize a signal for a specific wave band. The phase deviation is a key point to determine whether other frequency band signals could be suppressed so as to generate a smaller spur wave. Therefore, one of the reason to choose the injected locked type frequency divider rather than an Non-digital type frequency divider is that it is a looped type frequency divider, which could ensure the orthogonal relationship among phases of the output signals through an orthogonal input odd-order looped type frequency divider circuit 105 (refer to FIG. 8), wherein the number N in FIG. 8 represents a series. Since an injected locked type frequency divider is used, an odd-order (N=2k+1) divider cell and an orthogonal input (t=90°) are adopted.

The buffer and the combination of buffer and mixer 30 according to the frequency synthesizer architecture 2 of the present invention include a tri-mode buffer 310 and a single baseband mixer 320.

Figure 3:
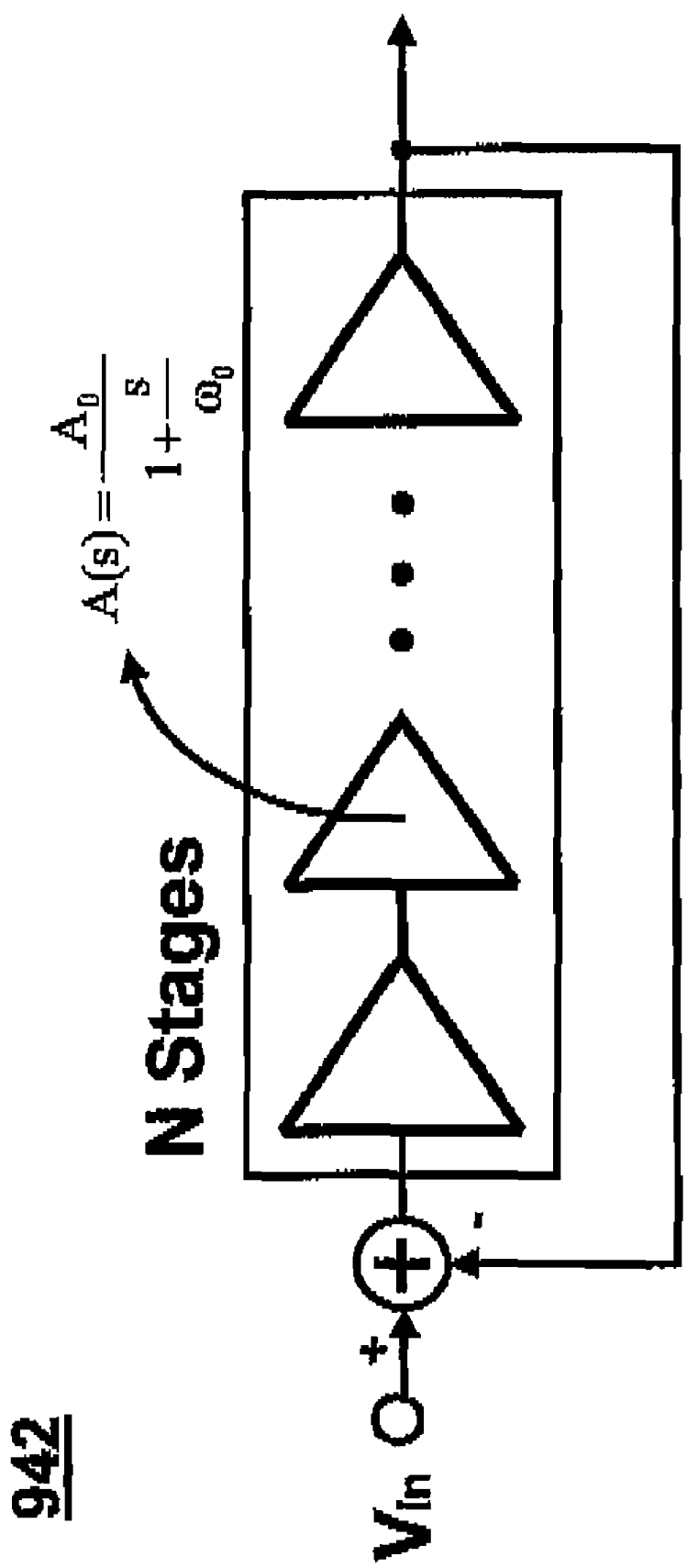
FIG. 3 is a diagram illustrating a conventional VCO according to the prior art.
Figure 9:
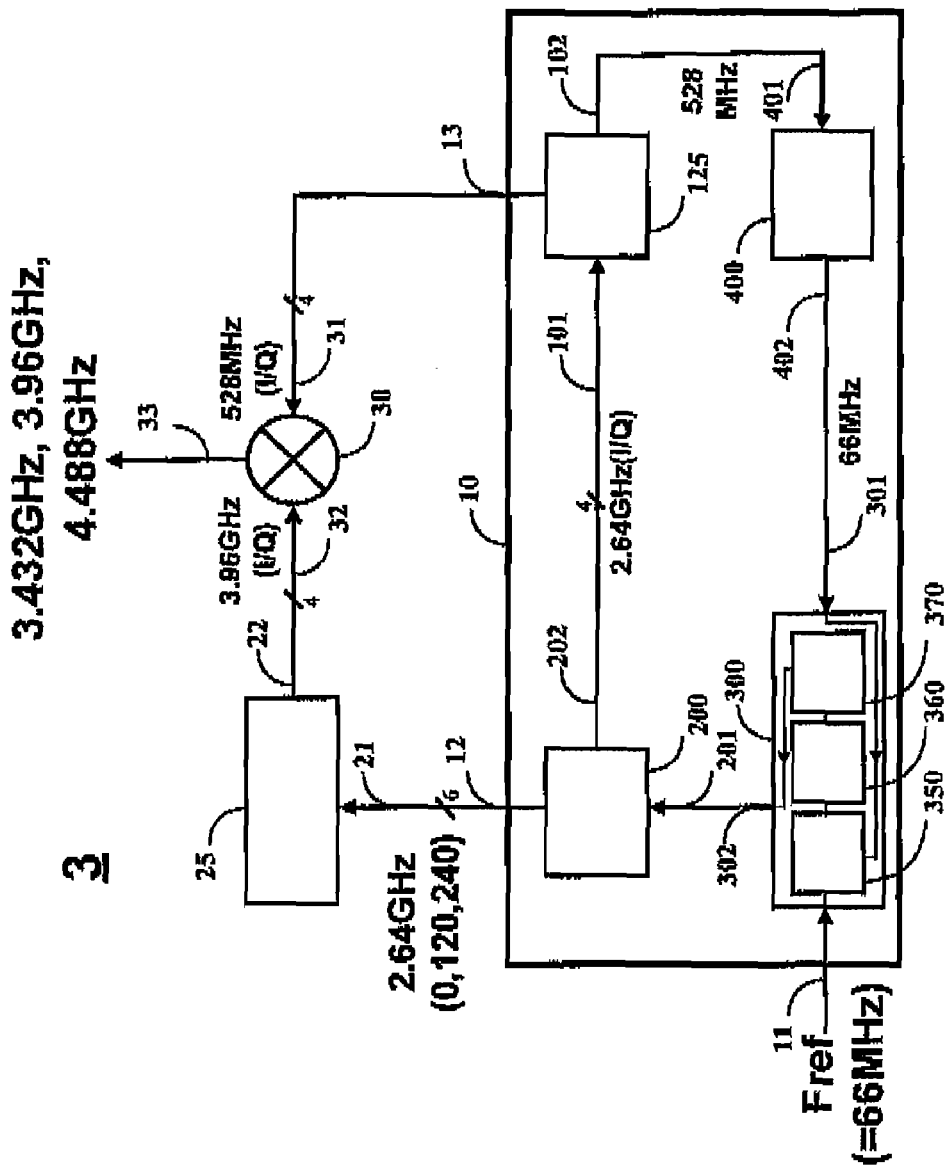
FIG. 9 is a diagram illustrating a second preferred embodiment of the frequency synthesizer according to the present invention.

Please refer to FIG. 9 which is a diagram illustrating a second preferred embodiment of the frequency synthesizer according to the present invention. A third frequency synthesizer architecture 3 in accordance with the second preferred embodiment of the present invention. The difference between the third frequency synthesizer architecture 3 and the second frequency synthesizer architecture 2 is that a pair of third-order looped type VCO 200 coupled with each other included in the phase-locked loop 10 having a detecting signal output 202 and a first output 12 electrically connected to the first output 12 wherein each looped type VCO 200 has three-circuit cells 2000~2002/2003~2005, and each three-circuit cells 2000~2002/2003~2005 has a digital multiband selective load circuit for selecting a band among different oscillating bands. In accordance with an N-order looped VCO shown in FIG. 3, its oscillating condition is:

$$H(j\omega_{OSC}) = -\left(\frac{A_0}{1+\frac{j\omega_{OSC}}{\omega_0}}\right)^N = 1, \quad (1)$$

wherein A0 is a single-order oscillator direct current gain, the frequency of w0 is 3 dB. Besides, a single-order oscillating system A(s) could be expressed as follows:

$$A(s) = \frac{A_0}{1+\frac{s}{\omega_0}} = \frac{GmR}{1+sRC}, \quad (2)$$

wherein R is the output resistance and C is the output capacitor. An oscillating condition is obtained as follows by substituting equation (2) into equation (1):

$$H(j\omega_{OSC}) = -\left(\frac{GmR}{1+sRC}\right)^N = 1 \quad (3)$$

$$\Rightarrow Gm = \frac{\sqrt{1+\left(\tan\left(\frac{180°}{N}\right)\right)^2}}{R} = \omega_{OSC} \cdot C \cdot \frac{1}{\sin\left(\frac{180°}{N}\right)},$$

thus it is known that under the same oscillating frequency and the same output capacitor, the power (Gm) is increased in accordance with the incensement of N. Therefore, for generating 12 phases, the three-order coupled looped VCO consumes lesser power than six-order looped VCO (0.577 times) and performs better for suppressing noises.

The characteristic of this coupled looped VCO 200 is to abandon the conventional scheme that a fixed resistive load is used to adjust the characteristic curve of the VCO voltage with respect to the frequency so as to raise the Kvco (the variation of the frequency/the control voltage to the linear portion of the curve and magnitude of the slope to the linear portion of the curve) in order to influence the performance of the spur wave, but a multiband selective scheme is adopted so that a smaller Kvco could be obtained therein and the required operation bandwidth could still be covered.

Figure 10:
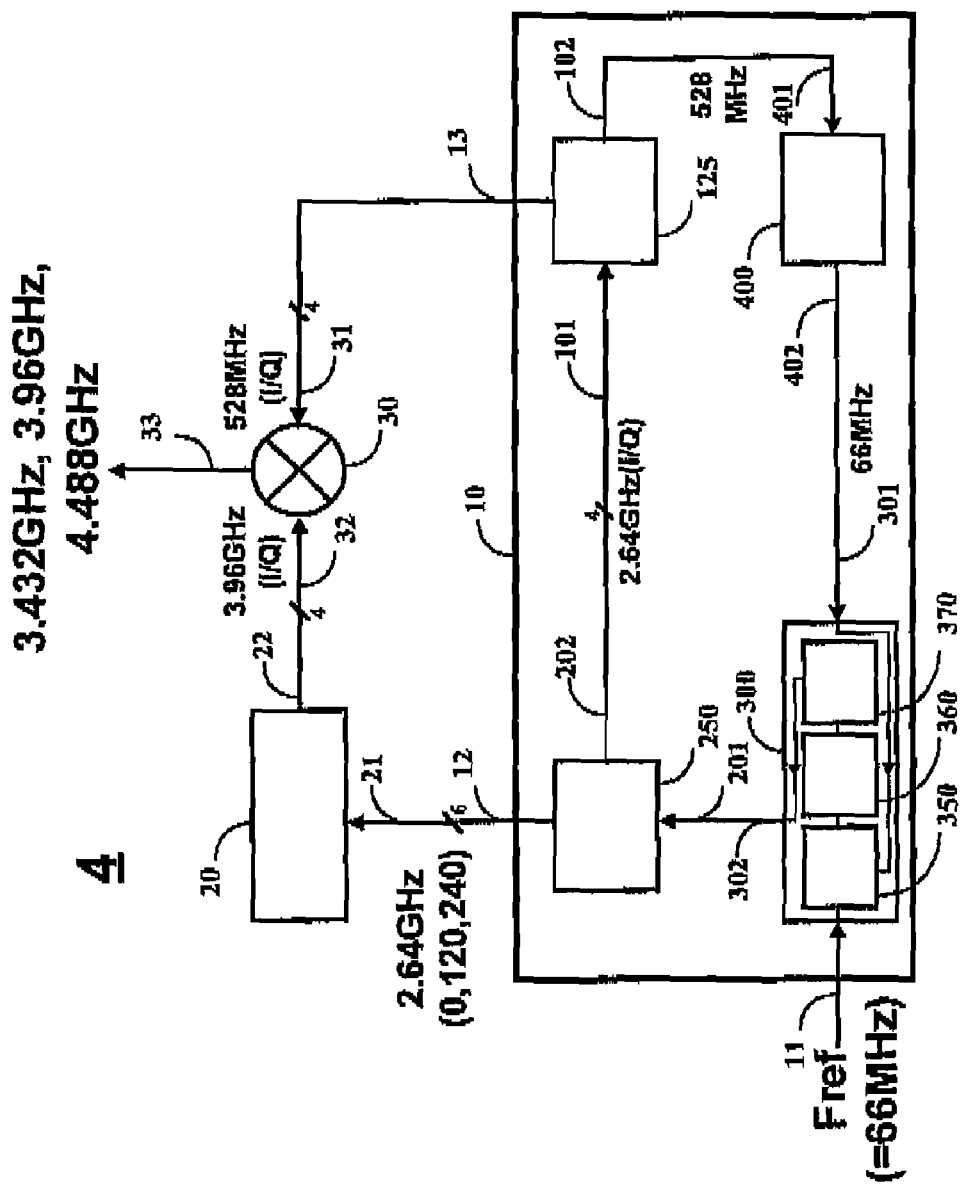
FIG. 10 is a diagram illustrating a third preferred embodiment of the frequency synthesizer according to the present invention.

Please refer to FIG. 10 which is a diagram illustrating a third preferred embodiment of the frequency synthesizer according to the present invention. A fourth frequency synthesizer architecture 4 in accordance with the third preferred embodiment of the present invention. The difference between the fourth frequency synthesizer architecture 4 and the second and third frequency synthesizer architectures 2 and 3 is that a current-reuse multiply-by-1.5 circuit has a first input 21 electrically connected to the first output 12 and a third output 22.

The characteristic of the current-reuse multiply-by-1.5 circuit 20 is that a first sub-circuit 23 and a second sub-circuit 24 are included therein, wherein the first sub-circuit 23 and a second sub-circuit 24 are driven by the same electrical current, so as to reduce the approximate 40% power consuming in the conventional multiply-by-3 circuit in series and divide-by-2 circuit in series, and to reduce the occupied area of the circuit (more detail will be described later).

It is noted that, a single phase-locked loop 10 could substantially reduce the occupied area by a plural sets of the phase-locked loops. Besides, the frequency synthesizer architecture according to the present application covers the feature circuits in the following respective or common usage: that is, a pair of divide-by-5 circuit 100 included in the phase-locked loop 10, a pair of looped VCO 200 included in the phase-locked loop 10 and the current-reuse multiply-by-1.5 circuit 20.

Generally, the architecture according to the present invention could reduce the occupied area by the circuit, reduce the power consuming and more precisely define an orthogonal input phase so that the in-band spur will perform better.

Please refer back to FIG. 7(a). The coupled divided-by-5 circuit 100 in accordance with the present invention includes a first set of divide-by-5 circuit 120 having a first first orthogonal input 1206, five first first inputs 1201~1205 and five first first outputs 1221~1225, wherein the first first orthogonal input 1206 is controlled by a first first input signal 140; a second set of divide-by-5 circuit 130 having a second first orthogonal input 1306, five second first inputs 1301~1305 and five second first outputs 1321~1325, wherein the second first orthogonal input 1306 is controlled by a second first input signal 150, and the second first input signal 150 and the first first input signal 140 are orthogonal with each other.

The divide-by-5 circuits 120/130 further include five first first inverters 1241~1245 respectively electrically connected between the corresponding five first first outputs 1221~1225 and the corresponding five second first outputs 1321~1325. Furthermore, the divide-by-5 circuits 120/130 further include five circuit cells 1001~1005/1021~1025, wherein the respective cells has the first first 1201~1205 or the second first inputs 1301~1305 and the first first 1221~1225 or the second first outputs 1321~1325, and the divide-by-5 circuits 120/130 further includes four second first inverters 1341~1344 electrically connected between one of the five second first outputs 1321~1325 and the next first first output of one of the corresponding five first first outputs 1221~1225.

Please refer back to FIG. 7(c). One of each the circuit cells 1001~1005/1021~1025 includes an NMOS 141 has a first gate 142, a first drain 143 and a first source 144; a PMOS 145 has a second gate 146, a second drain 147 and a second source 148, wherein the first gate 142 is electrically connected to the second gate 146 whereby a first first or second first inputs 1201~1205/1301~1305 are formed, a first drain 143 is electrically connected to the second drain 147, whereby the first first or the second first outputs 1221~1225/1321~1325 of each cells 1001~1005/1021~1025 are formed, the first source 144 includes the first first or second first orthogonal inputs 1206/1306, and the second source 148 is electrically connected to a power Vd. The orthogonal input 1206/1306 of the divide-by-5 circuits 120/130 are electrically connected to the drain 1491 of an NOMS 149 and each the input signals 140/150 is injected from the gate 1492 of the NMOS 149. Besides, each five first first or second first outputs 1221~1224/1321~1324 is electrically connected to the next first first output of the first first or second first inputs 1202~1205/1302~1305 and the last first first and second first outputs 1225/1325 are invertedly electrically connected to the foremost first first and second first outputs 1201/1301.

Typically, for the divide-by-5 circuits 120/130, the first set of divide-by-5 circuit 120 further includes a first second orthogonal input 1207, five first second inputs 1211~1215 and five first second outputs 1231~1235, wherein the first second orthogonal input 1207 is controlled by a first second input signal 160 and the first second input signal 160 is invertedly electrically connected to the first first input signal 140; the second set of divide-by-5 circuit 130 further includes a second second orthogonal input 1307, five second second inputs 1311~1315 and five second second outputs 1331~1335, wherein the second second orthogonal input 1307 is controlled by the second second input signal 170 and the second second input signal 170 is orthogonal to the first second input signal 160 and is inverted to the second first input signal 150. the divide-by-5 circuits 120/130 further includes five first second inverters 1251~1255 which are respectively connected between the corresponding the five first second outputs and the five second second outputs 1331~1335. Furthermore, each the sets of the divide-by-5 circuits 120/130 includes five circuit cells 1001~1005/1021~1025 having the first second or second second inputs 1211~1215/1311~1315 and first second or second second outputs 1231~1235/1331~1335. The five divide-by-5 circuits 120/130 further include four second second inverters 1351~1354 which are electrically connected between one of the five second second outputs 1331~1335 and the next first second outputs 1231~1235 of one of the corresponding five first second outputs 1231~1235. Besides, please refer back to FIG. 7(b), and it is illustrated the relationships among each input signals 140, 150, 160 and 170 of the coupled divide-by-5 circuit. It is apparent that the input signal 140 is orthogonal to the input signal 150, the input signal 140 is inverted to the input signal 160, the input signal 170 is orthogonal to the input signal 160 and the input signal 170 is inverted to input signal 150.

Please refer back to FIG. 7(d). Each of the circuit cells 1001~1005/1021~1025 includes a first circuit 180 including the first first or second first inputs 1201~1205/1301~1305 of respective cells, the first first or second first orthogonal inputs 1206/1306 of respective cells and a first power input Vd1; and a second circuit 190 including the first second or second second inputs 1211~1215/1311~1315 of the respective cells, the first second or second second orthogonal inputs 1207/1307 of the respective cells and a second power input Vd2 which is electrically connected to the first power input Vd1 and a pair of cross-coupled PMOS 151 which is electrically connected between the first circuit and the second circuit 180/190 so as to suppress an Noise of the power.

More detailed, take the cross-coupled PMOS 151 as the example for the circuit cell having the second third output out-/out+ to be the first first and the first second output 1221~1225/1231~1235 of the respective cells or the second first and second second output 1321~1325/1331~1335 of the respective cells. The first circuit 180 includes a first NMOS 108 having a first first gate 182, a first first drain 183 and a first first source 184; and a first PMOS 185 having a first second gate 186, a first second drain 187 and a first second source 188, wherein the first first gate 182 is electrically connected to the first second gate 186 so as to form the first first or second first input 1201~1205/1301~1305 of the respective cells, the first first drain 183 is electrically connected to the first second drain 187 so as to form the first first or second first output 1221~1225/1321~1325, the first first source 184 forms the first first or second first orthogonal input 1206/1306, and the first second source 188 is electrically connected to the power Vd1/Vd2. The second circuit 190 includes a second NMOS 191 having a second first gate 192, a second first drain 193 and a second first source 194; and a second PMOS 195 having a second second gate 196, a second second drain 197 and a second second source 198, wherein the second first gate 192 is electrically connected to the second second gate 196 so as to form the first second or second second input 1211~1215/1311~1315 of the respective cells, the second first drain 193 is electrically connected to the second second drain 197 so as to form the second first or second second output 1231~1235/1331~1335 of the respective cells, the second first source 194 forms the first second or second second orthogonal input 1207/1307, and the second second source 198 is electrically connected to the power Vd1/Vd2.

Figure 1:
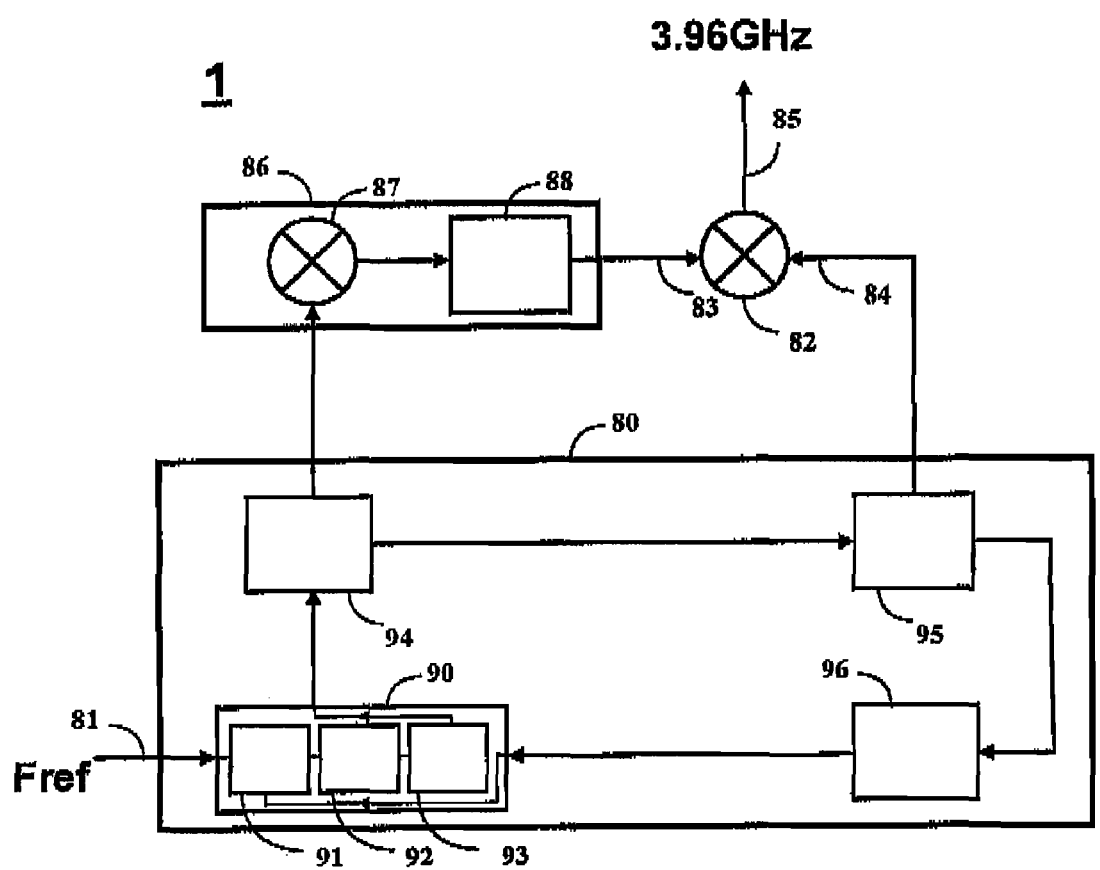
FIG. 1 is a diagram illustrating a frequency synthesizer according to the prior art.
Figures 2A, 2B:
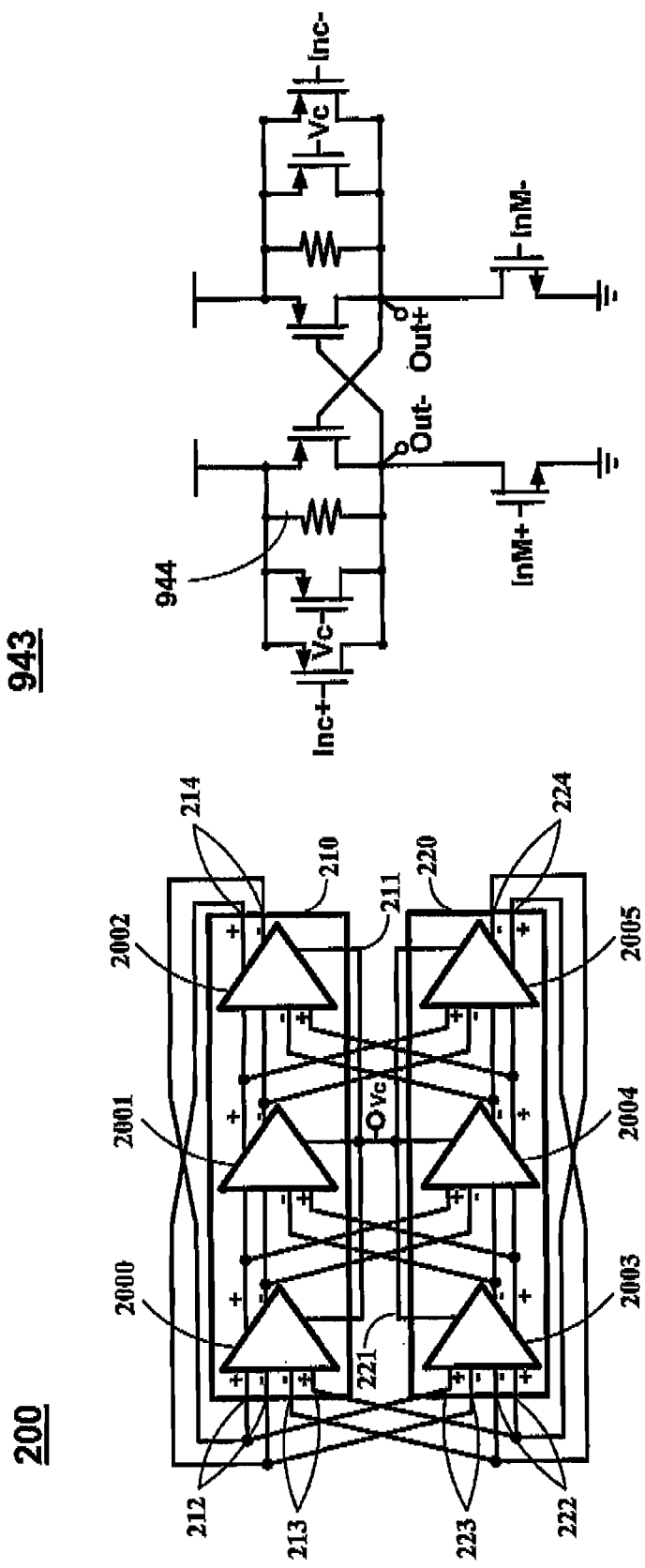
FIG. 2(a) is a diagram illustrating a three order looped VCO the according to the prior art.
FIG. 2(b) is a circuit diagram illustrating a single order looped VCO the according to the prior art.
Figure 11:
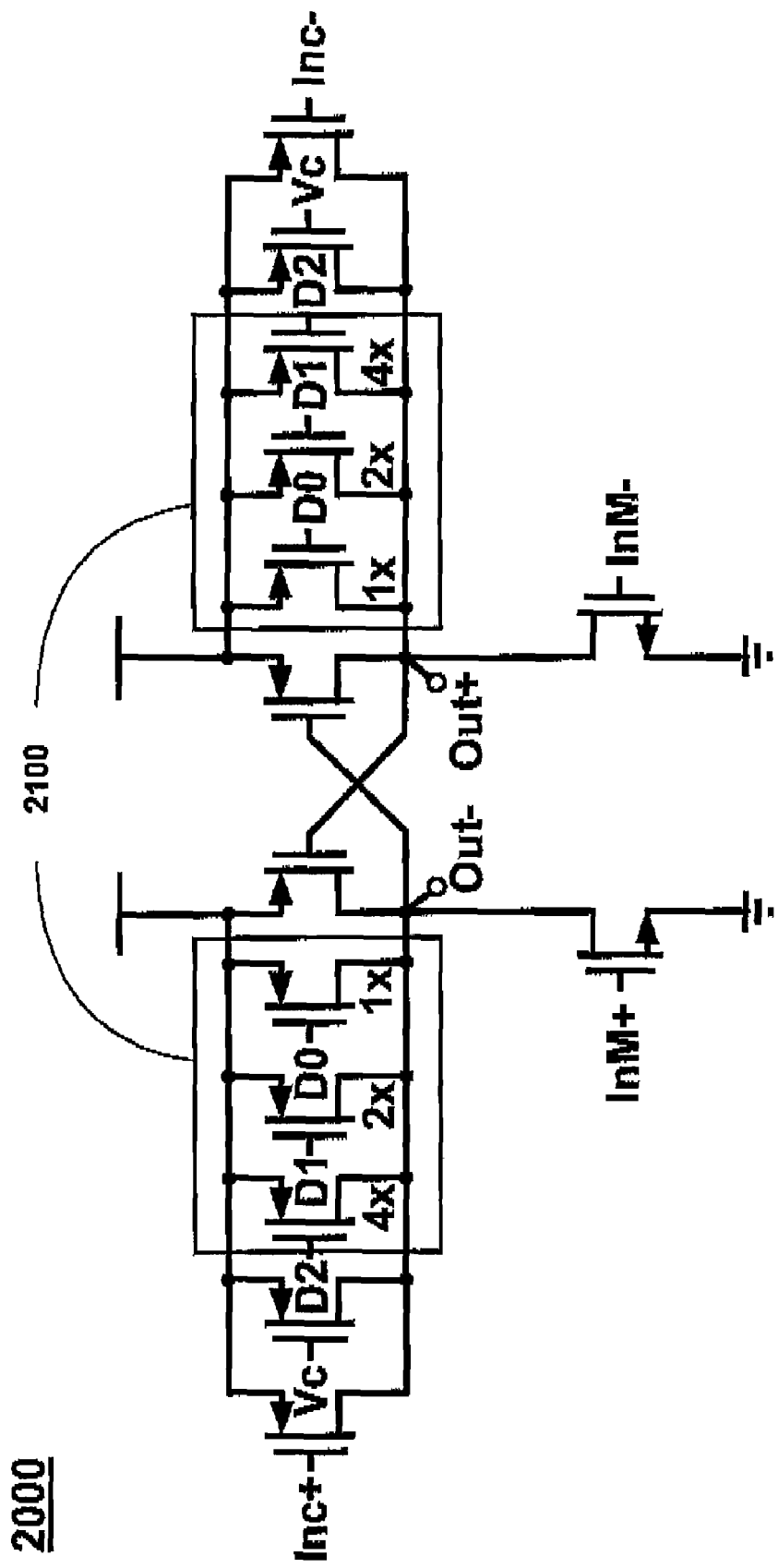
FIG. 11 is a circuit diagram illustrating a preferred embodiment for the single order VCO of the frequency synthesizer according to the present invention.

Please refer back to FIG. 2(a). A coupled looped VCO 200 includes a first oscillator 210 having a first control input 211, a first first input 212, a first second input 213, and a first first output 214, wherein a control signal Vc is received by the first control input 211; a second oscillator 220 having a second control input 221, a second first input 222, a second second input 223, and a second first output 224, wherein a control signal Vc is received by the second control input 221. Please refer to FIG. 11, which is a circuit diagram illustrating a preferred embodiment for the single order VCO of the frequency synthesizer according to the present invention. Each the VCOs 210/220 has a circuit cell, i.e. the circuit cell 2000, and each the of the circuit cells 2000 has a digital multiband selective load circuit consisted of a PMOS having a plurality of loads whose magnitude is different with each other and a digital logic control circuit (D0, D1 and D2 only), so as to select a band among different oscillating bands. Since the band is associated with the load circuit 2100, it is able to switch among different frequency band through switching the logic circuit and to use a lesser control voltage to cover the desired frequency range with maintaining an appropriate Kvco. Therefore, it is able to improve the aforementioned shortage that a fixed resistive load 944 is used to adjust the characteristic curve of the VCO voltage with respect to the frequency so as to raise the Kvco (the variation of the frequency/the control voltage to the linear portion of the curve and magnitude of the slope to the linear portion of the curve) to influence the performance of the spur wave.

Figure 4:
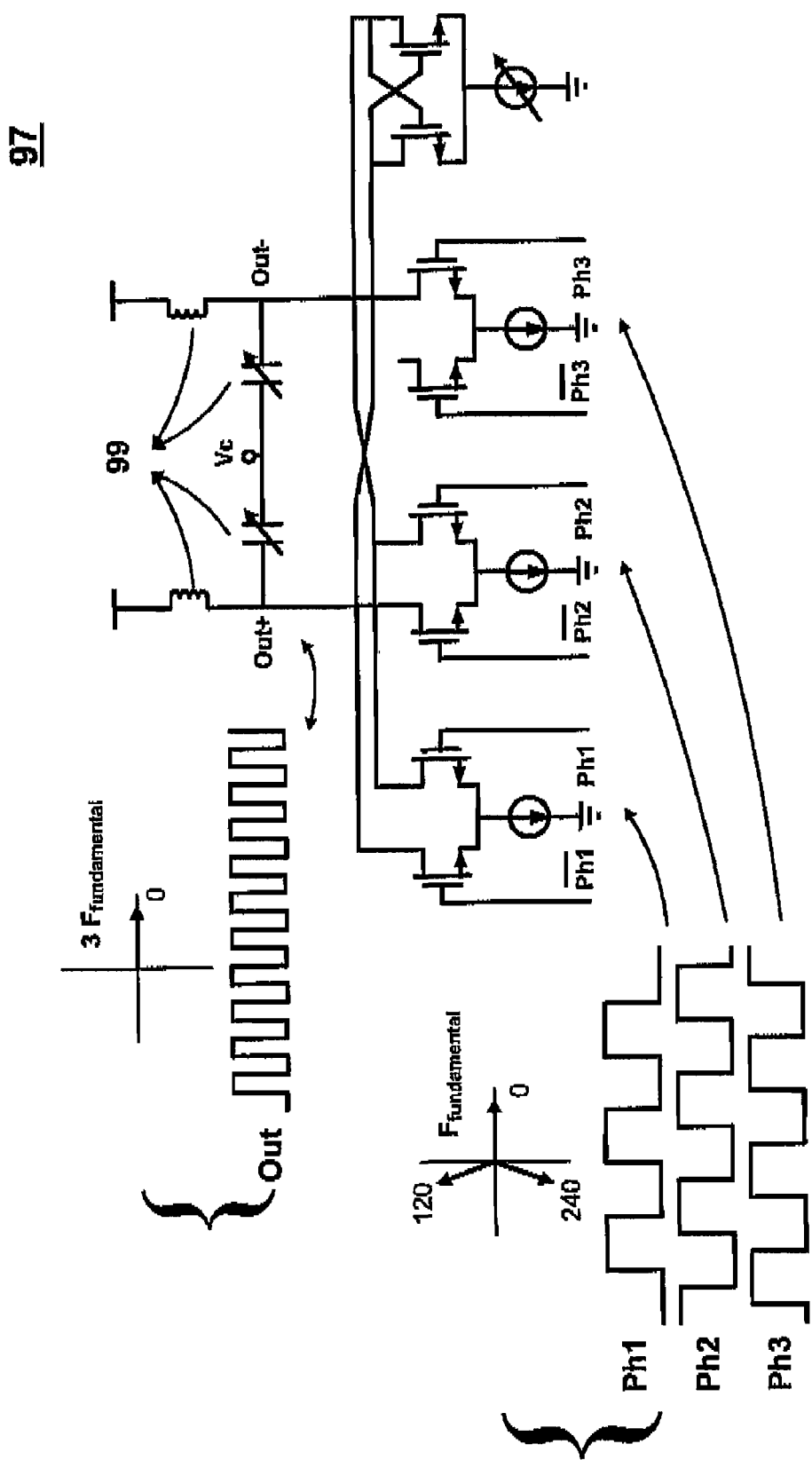
FIG. 4 is a diagram illustrating a conventional injected multiply-by-3 circuit.
Figure 5B:
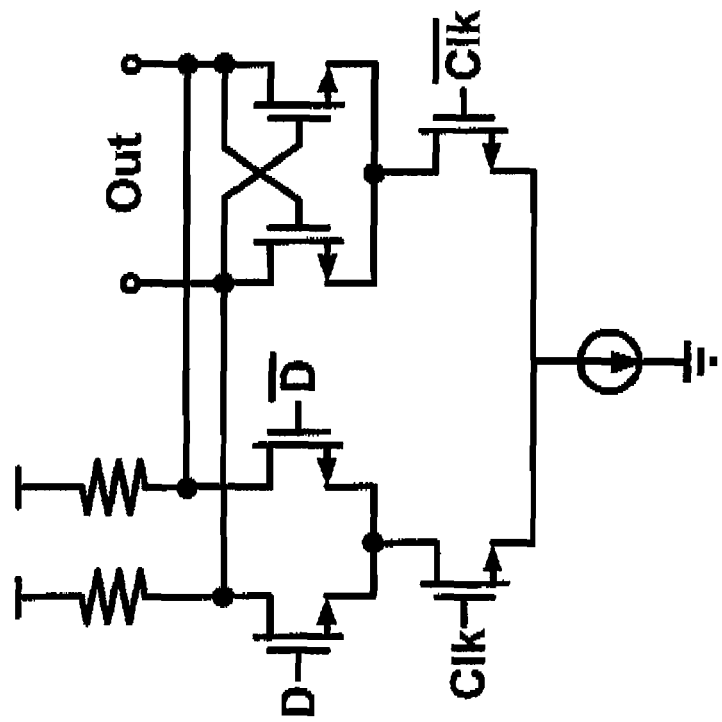
FIG. 5(b) is a detailed circuit diagram illustrating a detailed Latch circuit of a conventional CML divide-by-2 circuit.
Figure 5A:
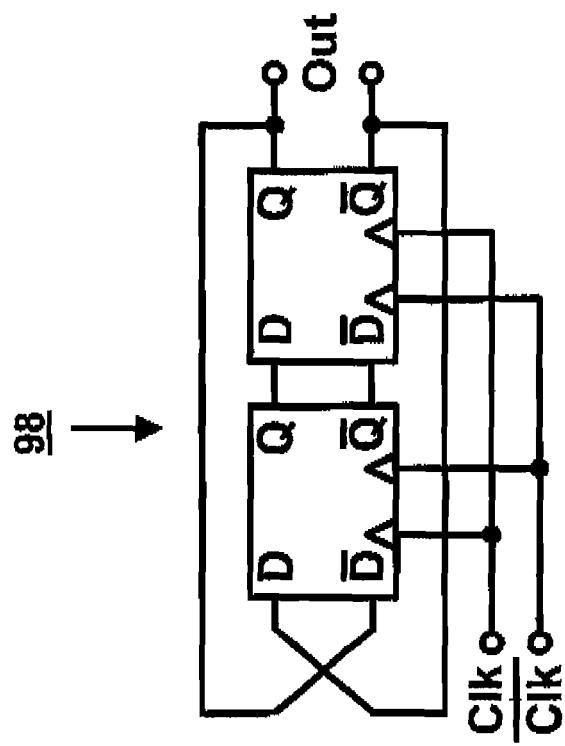
FIG. 5(a) is a diagram illustrating a conventional CML divide-by-2 circuit.
Figure 12B:
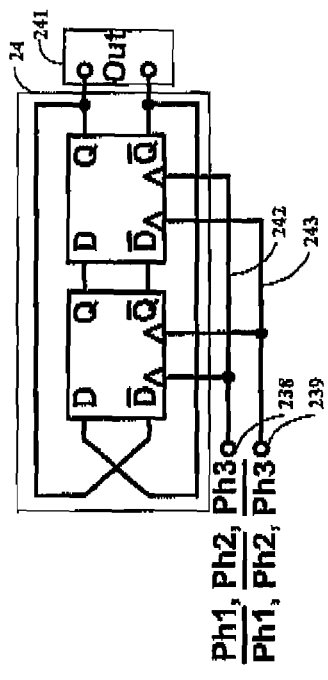
FIG. 12(b) is a diagram illustrating a preferred embodiment for the second sub-circuit of the current-reuse multiply-by-1.5 circuit of the frequency synthesizer according to the present invention.
Figure 12C:
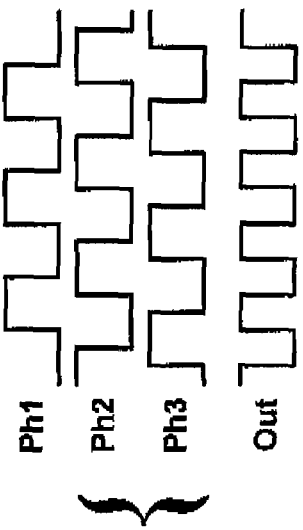
FIG. 12(c) is a diagram illustrating a preferred embodiment for respective pairs of the differential input corresponding signals and the output corresponding signals of the current-reuse multiply-by-1.5 circuit of the frequency synthesizer according to the present invention.
Figure 12A:
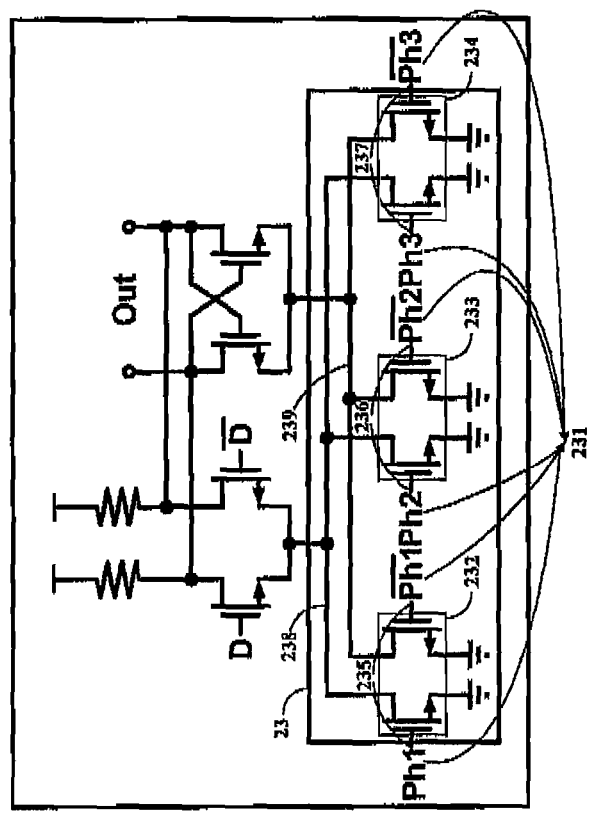
FIG. 12(a) is a diagram illustrating a preferred embodiment for the first sub-circuit of the current-reuse multiply-by-1.5 circuit of the frequency synthesizer according to the present invention.

A current-reuse multiply-by-1.5 circuit 20 includes a first sub-circuit 23 having a first input 231 (refer to FIG. 12(a)) and a second sub-circuit 24 having a second output 241 (refer to FIG. 12(b)), wherein the first sub-circuit 23 is from a multiply-by-3 circuit 97 (more detail will be described in FIG. 4) but a passive component and a portion of the circuit is omitted. The second sub-circuit 24 is from a multiply-by-2 circuit 98 (more detail will be described in FIGS. 5(a) and 5(b)) and is electrically connected to the first sub-circuit 23, so that the first sub-circuit 23 and the second sub-circuit 24 are driven by the same current. It is known from FIG. 12(a) that the first sub-circuit 23 of the current-reuse multiply-by-1.5 circuit 20 includes three pairs of the differential input NMOSs 232~234, and each of the differential input NMOSs 232~234 has a plurality of gate differential inputs 235~237 so as to form a first input 231, a drain first output 238, and a drain second output 239, wherein FIGS. 4 and 12(c) could be alternatively referred so as to show the differential input signal 235~237. The Ph1, Ph2 and Ph3 in the present invention are three signals whose frequencies are the same but the phase difference is 120° and the Ph1, Ph2 and Ph3 are the inverted signal of the Ph1, Ph2 and Ph3 signal (the phase difference is 180°). Besides, it is known from FIG. 12(b), the second sub-circuit 24 is a current mode logic (CML) divide-by-2 circuit has a first control input 242 and a second control input 243, and the first control input 242 is electrically connected to the first output 238 of the respective drains and the second control input 243 is electrically connected to the second output 239 of the respective drains, wherein the output signal 241 could be illustrated by FIG. 4 and FIG. 12(c) and it is apparent that Out and the frequency of input signal Ph1 is not still the three times frequency illustrated in FIG. 4 but the 1.5 times frequency. Besides, the CML illustrated in FIG. 5(b) is a CML Latch detailed circuit of the CML divide-by-2 circuit that is typically a D-Latch.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims that are to be accorded with the broadest interpretation, so as to encompass all such modifications and similar structures. According, the invention is not limited by the disclosure, but instead its scope is to be determined entirely by reference to the following claims.

What is claimed is:

1. A frequency synthesizer, comprising:
   a single phase-locked loop having a reference frequency signal input, a first output, a second output and a pair of divide-by-N circuits coupled with each other and electrically connected to the second output;
   a multiply-by-M circuit having a first input electrically connected to the first output and a third output;
   a combination of a buffer and a mixer having a second input electrically connected to the second output and a third input electrically connected to the third output generating a frequency signal output; and
   a plurality of inverters connected to each of the pair of divide-by-N circuits so as to reduce a mismatch generated therefrom.

2. The frequency synthesizer according to claim 1, wherein the single phase-locked loop further comprises:
   a frequency detecting circuit having the reference frequency signal input and a feedback frequency input, and generating a detecting signal output;
   a voltage controlled oscillator (VCO) having a detecting signal input electrically connected to the detecting signal output, a fourth output and the first output, wherein the pair of divide-by-N circuits further comprise a fourth input electrically connected to the fourth output and a fifth output; and
   a divide-by-P circuit having a fifth input electrically connected to the fifth output and a feedback frequency output electrically connected to the feedback frequency input.

3. The frequency synthesizer according to claim 2, wherein the frequency detecting circuit further comprises:
   a phase frequency detecting circuit electrically connected to the reference frequency signal input and the feedback frequency input;
   a charge pump electrically connected to the phase frequency detecting circuit; and
   a low-pass filter electrically connected to the charge pump and the detecting signal output.

4. The frequency synthesizer according to claim 1, wherein the multiply-by-M circuit is a multiply-by-1.5 circuit, which has a multiply-by-3 circuit electrically connected to the first input and a divide-by-2 circuit electrically connected to the multiply-by-3 circuit and the third output, and the divide-by-2 circuit is a current mode logic (CML) divide-by-2 circuit.

5. The frequency synthesizer according to claim 1, wherein the combination of the buffer and the mixer comprises a buffer being a tri-mode buffer and a mixer being a single baseband mixer.

6. A frequency synthesizer, comprising:
   a single phase-locked loop having a reference frequency signal input, a first output, a second output and a pair of voltage controlled oscillators (VCOs) coupled with each other and electrically connected to the first output, wherein each VCO has N circuit cells, each of which has a digital multiband selective load circuit selecting a band among different oscillating bands;
   a multiply-by-M circuit having a first input electrically connected to the first output and a third output; and
   a combination of a buffer and a mixer having a second input electrically connected to the second output and a third input electrically connected to the third output, and generating a frequency signal output.

7. The frequency synthesizer according to claim 6, wherein the single phase-locked loop further comprises:
   a frequency detecting circuit having the reference frequency signal input and a feedback frequency input, and generating a detecting signal output, wherein the pair of VCOs further comprise a detecting signal input electrically connected to the detecting signal output, a fourth output and the first output.

8. The frequency synthesizer according to claim 6, wherein the pair of VCOs comprise:
   a first oscillator having a first control input, a first input, a first second input and a first output, wherein the first control input receives a control signal; and
   a second oscillator having a second control input, a second first input, a second input and a second first output, wherein the control signal is received by the second control input, each VCO has a circuit cell, and each circuit cell has a digital multiband selective load circuit selecting a band among different oscillating bands.

9. The frequency synthesizer according to claim 8, wherein the digital multiband selective load circuit comprises a plurality of PMOSs, and each PMOS is controlled by the digital band selective circuit and has different load.

10. The frequency synthesizer according to claim 6, wherein the pair of VCOs are selected from one of a coupled N stage VCO and a coupled ring type VCO.

11. A frequency synthesizer, comprising:
   a single phase-locked loop having a reference frequency signal input, a first output and a second output, and including:
      a frequency detecting circuit having the reference frequency signal input and a feedback frequency input, and generating a detecting signal output:
      a voltage controlled oscillator (VCO) having a detecting signal input electrically connected to the detecting signal output, a third output and the first output, wherein the pair of divide-by-N circuits further comprise a first input electrically connected to the third output and a fourth output; and
      a divide-by-P circuit having a second input electrically connected to the fourth output and a feedback frequency output electrically connected to the feedback frequency input,
   a current-reuse single multiply-by-M circuit having a third input electrically connected to the first output and a fifth output, wherein the multiply-by-M circuit comprises a first sub-circuit and a second sub-circuit driven by the same current; and
   a combination of a buffer and a mixer having a fourth input electrically connected to the second output and a fifth input electrically connected with the fifth output generating a frequency signal output.

* * * * *